United States Patent [19]

Yeh et al.

[11] Patent Number: 5,862,073
[45] Date of Patent: Jan. 19, 1999

[54] FLOATING GATE MEMORY ARRAY DEVICE WITH IMPROVED PROGRAM AND READ PERFORMANCE

[75] Inventors: Jun-Lin Yeh; Ya-Chun Chang, both of Hsinchu, Taiwan

[73] Assignee: Winbond Electronics Corp., Taiwan

[21] Appl. No.: 931,065

[22] Filed: Sep. 15, 1997

Related U.S. Application Data

[63] Continuation of Ser. No. 615,167, Mar. 12, 1996, abandoned.

[51] Int. Cl.$^6$ ...................................................... G11C 7/00
[52] U.S. Cl. ................................ 365/185.01; 365/185.02; 365/189.06; 365/185.18; 365/189.01
[58] Field of Search ............................... 365/218, 185.12, 365/63, 189.06, 238.5, 185.02, 185.05, 185.11, 185.29, 185.01, 189.01

[56] References Cited

U.S. PATENT DOCUMENTS

| | | | |
|---|---|---|---|
| 5,029,130 | 7/1991 | Yeh | 365/186 |
| 5,185,718 | 2/1993 | Rinerson et al. | 365/218 |
| 5,287,307 | 2/1994 | Fukuda et al. | 365/189.06 |
| 5,289,411 | 2/1994 | Jeng et al. | 365/218 |
| 5,289,423 | 2/1994 | Natale et al. | 365/63 |
| 5,412,609 | 5/1995 | Ohtsuka et al. | 365/218 |
| 5,463,583 | 10/1995 | Takashina | 365/189.06 |

Primary Examiner—Vu A. Le
Attorney, Agent, or Firm—Proskauer Rose LLP

[57] ABSTRACT

A semiconductor memory array and method for use in a memory device in which the location of a memory cell in the array is specified by row address and column address decoders. The memory cells may be floating gate memory cells in which data is programmed by hot carrier injection and erased by Fowler-Nordheim tunneling. The array includes bit lines connected to the column address decoder, and word lines and N+ diffusion source lines connected to the row address decoder. Each memory cell has a gate connected to a word line, a drain connected to a bit line and a source connected to the N+ diffusion source line. A low resistance source line formed of metal II or other conductive material is arranged adjacent to each N+ source line and is electrically connected thereto at one or more locations via interconnecting straps. The low resistance source lines serve to reduce the voltage drop across the N+ diffusion source lines during program operations and provide an improved ground connection during read operations. The word lines are grouped into pairs of even and odd word lines and each pair makes up the minimum program unit or page. The page is also the minimum erase unit, such that adjacent even and odd word lines are erased simultaneously. The voltage applied to a given word line during a read operation may be supplied by a word line clamping circuit which limits gate disturbances resulting from fluctuations in supply voltage.

10 Claims, 5 Drawing Sheets

5,862,073

FLOATING GATE MEMORY ARRAY DEVICE WITH IMPROVED PROGRAM AND READ PERFORMANCE

This is a continuation of application Ser. No. 08/615,167, filed Mar. 12, 1996, abandoned.

FIELD OF THE INVENTION

The present invention relates generally to semiconductor memory devices and more particularly to a semiconductor memory device which includes a floating gate memory array.

BACKGROUND OF THE INVENTION

Floating gate memory devices which are programmed using hot electron injection and erased using Fowler-Nordheim tunneling are well-known and described in detail in U.S. Pat. Nos. 5,029,130 and 5,289,411. FIG. 1 shows an exemplary prior art floating gate memory array device 10 as disclosed in U.S. Pat. No. 5,289,411. The device 10 includes an array 40 of floating gate memory cells 42. The device 10 also includes an input buffer 12 which receives input data to be stored in the memory cells 42, a sense amplifier 16 which amplifies data signals read from the array 40, and an output buffer 14 which receives the read-out data signals from the amplifier 16. A column address decoder 18 receives a column address and generates an address signal on column address lines 26. A row address decoder 20 receives a row address and generates an address signal on row address lines 24. Each row address line 24 is connected to a row decoding circuit 50 which also receives row select lines 30 from a row select decoder 19. The output of the row decoding circuit 50 is a plurality of row lines 36. A pair of floating gate cells 42 are located at each intersection of the row lines 36 and a column address line 26. The device 10 further includes a high voltage (HV) source 22 which provides a high voltage potential for use in program and erase operations. The high voltage is supplied to a plurality of HV decoders 60 which each receive three HV select signals on lines 34 from an HV row select decoder 21. The HV decoders 60 are also connected to the row lines 36 from the corresponding row decoder 50.

The operation of the floating gate memory array device 40 is as follows. To program data in a given row of the floating gate memory cells 42, the selected row address line 24 is brought to Vcc potential. A threshold voltage Vt is supplied via the row decoder 50 to the first row line 36-1 in the given row and thereby to the gates of the memory cells 42 in that row. Source isolation transistors 44 are not turned on by the voltage Vt. A voltage of approximately +12 volts is supplied to the source of each of the cells 42 in that row via the second row line or N+ source line 36-2, the HV decoder 60 and the HV source 22. A given cell 42 in the activated row is programmed by bringing the corresponding column address line 26 and thereby the drain of the given cell 42 to either 0 volts or +5 volts depending on the logic value to be programmed. Hot electrons from the source of the given cell 42 can thereby be injected into and stored on the floating gate of the cell. The data stored in a given row of cells may be read back in a conventional manner. For example, the source of a given cell to be read can be brought to ground potential, the drain to a read voltage on the order of +2 volts and the gate to +5 volts. This will generate a signal indicative of the stored charge which is amplified by sense amplifier 16 and supplied to output buffer 14.

To erase data stored in the floating gate cells 42 of a given row of array 40, the row address line 24 for that row is activated. The row select decoder 19 supplies signals to row decoder 50 such that the first row line 36-1 connected to the gates of source isolation transistors 44 in the given row is held high while the second and third row lines 36-2 and 36-3 are held at ground potential. The source isolation transistors 44 are turned on to thereby connect a common ground line 32 to the second row line or N+ source line 36-2. The first row line 36-1 is then connected via HV decoder 60 to the high voltage from HV source 22. This supplies a potential of about +15 volts to the gate of each floating gate cell 42 in the given row. The column address lines 26 connected to the drains of each memory cell 42 in the given row are then brought to ground potential. The source of each of the memory cells 42 in the given row is also brought to ground potential via source isolation transistors 44 which connect the N+ source line 36-2 to the common ground line 32. The high voltage potential on the gate of the floating gate cells 42 causes the charge stored on the floating gate to be removed by the mechanism of Fowler-Nordheim tunneling.

The prior art floating gate memory array device 10 of FIG. 1 suffers from a number of problems. For example, the array 40 utilizes source isolation transistors 44 to isolate the high +12 volt source voltage used in programming a given cell 42 from other cells in the array. Although source isolation via transistor 44 can provide some reduction in program disturbance, the presence of the transistors 44 decreases the read current through a given cell and thereby degrades the read performance of the array device 10. Also, the programming current from HV decoder 60 runs through the entire length of an N+ source line 36-2 which is typically formed from high resistance N+ diffusion material. The programming current will thus result in a significant voltage drop across the source line 36-2 which can degrade programming efficiency and performance. Furthermore, the source isolation transistors 44 require chip space and thus result in an undesirable increase in the chip size for the memory array device 10. Another problem with the prior art memory array device 10 is that during a read operation, the signal Vcc-Vt is applied directly to the gates of a given row of memory cells 42 via the row lines 36-1 and/or 36-3. All of the cells 42 in the given row will therefore be stressed by the high Vcc voltage. Also, an increase or other disturbance in the supply voltage during a read operation can result in charges previously stored in the cells 42 being pulled away from the floating gates thereof via Fowler-Nordheim tunneling.

As is apparent from the above, there is a need for an improved floating gate memory array which exhibits improved read and program performance and eliminates the source isolation transistor requirement and other problems of the prior art.

SUMMARY OF THE INVENTION

The present invention provides an improved floating gate memory array which exhibits improved read and program performance relative to prior art devices. A floating gate memory array in accordance with a preferred embodiment of the invention completely eliminates the requirement for source isolation transistors on the word lines of the memory array.

A semiconductor memory array in accordance with one embodiment of the invention is implemented in a memory device in which the location of a memory cell in the array is specified by row address and column address decoders. The memory cells may be floating gate memory cells in which data is programmed by hot carrier injection and erased by Fowler-Nordheim tunneling. The array includes bit lines connected to the column address decoder, word lines connected to the row address decoder and N+ diffusion source lines connected to the row address decoder. Each memory cell has a gate connected to a word line, a drain connected to a bit line and a source connected to the N+ diffusion source line. A low resistance source line formed of metal II or other conductive material is arranged adjacent to each N+ source line and is electrically connected thereto at one or more locations via interconnecting straps. The low resistance source lines serve to reduce the voltage drop across the N+ diffusion source lines during program operations and provide an improved ground connection during read operations.

Another aspect of the invention involves a page organization in which two adjacent word lines, referred to herein as even and odd word lines, are grouped together as a basic program unit such that any cell disturbance arising during a program operation is restricted to the cells connected to the two word lines. Other cells in the array which are not part of the page being programmed are substantially unaffected by the program operation. The two adjacent word lines are also simultaneously erased during an erase operation.

A further aspect of the invention involves a word line clamping circuit which may be utilized to reduce read disturbances arising from increases or other fluctuations in the Vcc supply voltage during a read operation. The word line clamping circuit limits the highest voltage that can be supplied to the word lines during read operations to thereby provide improved immunity to gate disturbances induced by variations in Vcc.

These and other advantages and features of the present invention will become more apparent from the accompanying drawings and the following detailed description.

DETAILED DESCRIPTION OF THE INVENTION

The present invention will be illustrated below in conjunction with an exemplary floating gate semiconductor memory device. It should be understood, however, that the present invention is not limited to use with any particular type of device or memory cell. The invention is instead more broadly applicable to any semiconductor device in which inherent resistance is a concern. Furthermore, although the invention is particularly well-suited for use in floating gate memory devices, it may also provide significant advantages in numerous other applications.

Figure 1:
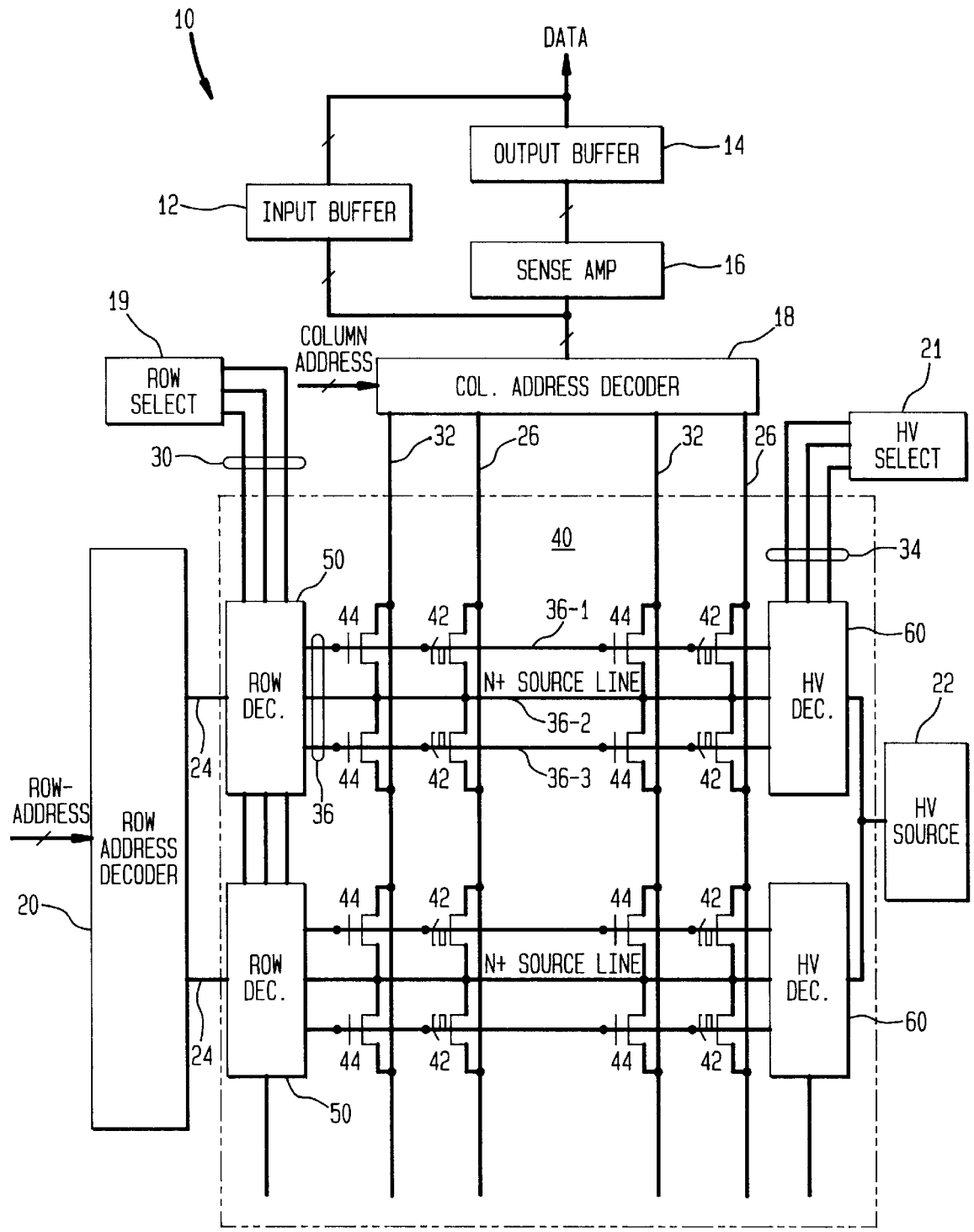
FIG. 1 shows a semiconductor memory device including a floating gate memory array in accordance with the prior art.
Figure 2:
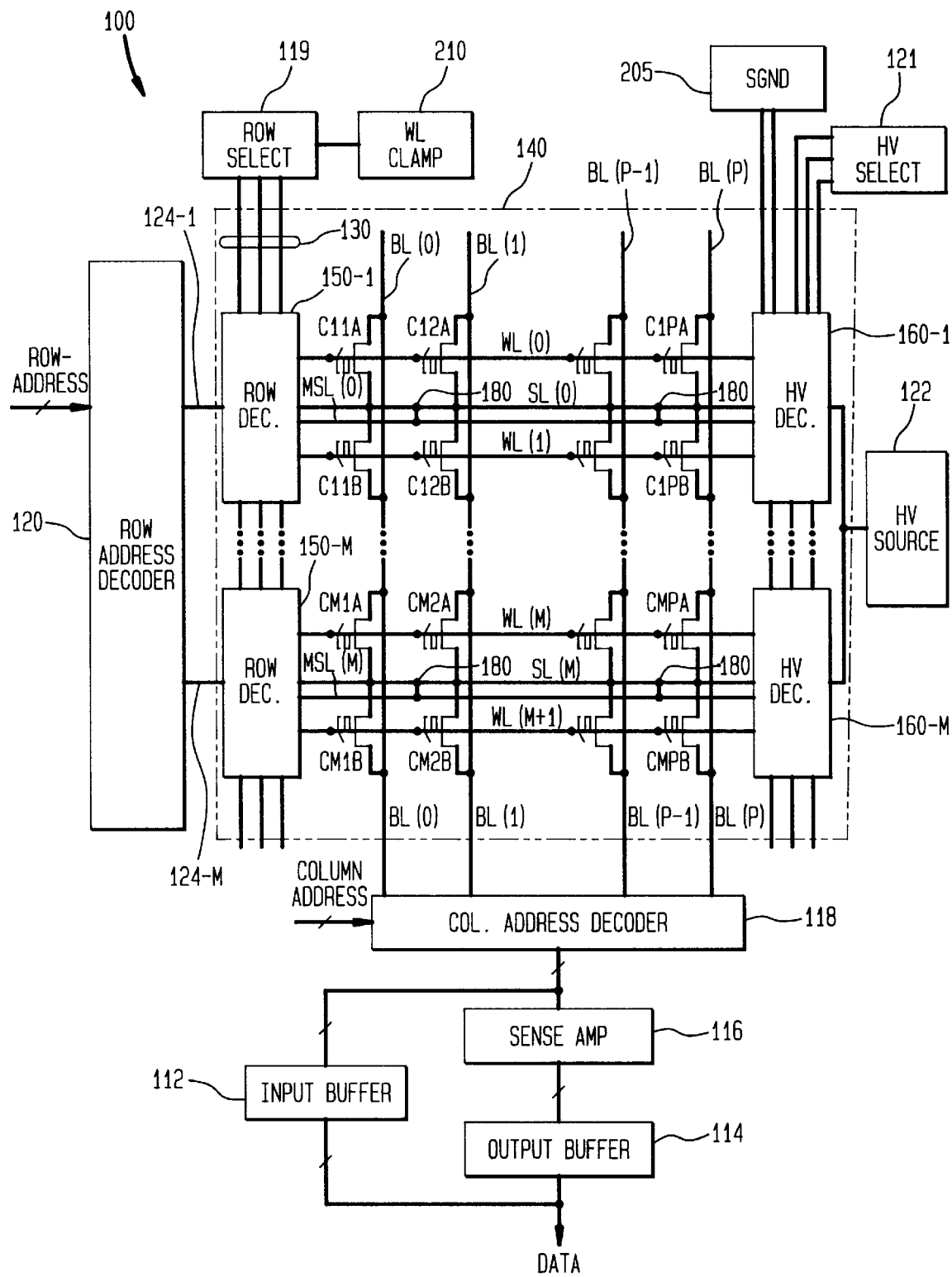
FIG. 2 shows a semiconductor memory device including a floating gate memory array in accordance with the present invention.

FIG. 2 shows a floating gate memory array device 100 in accordance with the present invention. The device 100 includes an input buffer 112, output buffer 114, sense amplifier 116, column address decoder 118, row select decoder 119, row address decoder 120, high voltage (HV) select decoder 121 and HV source 122. These elements operate in a conventional manner such as that described above in conjunction with FIG. 1. Additional detail regarding the operation of these elements can be found in U.S. Pat. Nos. 5,029,130 and 5,289,411, which are incorporated by reference herein.

The device 100 further includes an (M+1)×(P+1) floating gate memory array 140 with a number of floating gate memory cells CijA and CijB, where i=0, 1, 2, . . . M denotes the row in which a given cell CijA or CijB is located and j=0, 1, 2, . . . P denotes the column in which the given cell is located. In the exemplary embodiment of FIG. 2, each row M of the array 140 includes an even word line WL(M) and an odd word line WL(M+1). It should be noted that the odd word line WL(M+1) for a given row M is not the same word line as the even word line WL(M) for the next row M+1. The even word line WL(M) for a given row M is connected to the gates of memory cells CMjA within the row M. The odd word line WL(M+1) is connected to the gates of memory cells CMjB within the row M. Each column P of the array 140 includes a bit line BL(j). The bit line BL(j) in a given column j is connected to the drains of the memory cells CijA and CijB in that column. The location of each memory cell in the array is completely specified by the intersection of a word line WL and a bit line BL.

Each row M of the array 140 further includes a source line SL(i) and a metal source line MSL(i). Both the source line SL(i) and metal source line MSL(i) pass horizontally through the array 140. The source of each of the memory cells CijA and CijB in a given row i are connected to the source line SL(i). The source line SL(i) may be formed in a conventional manner from an N+ diffusion region. The metal source line MSL(i) is arranged substantially parallel to SL(i) between the even and odd word lines and may be formed from a metal II region or second metallization layer in the device 10. MSL(i) is electrically connected to SL(i) at various points in the array 140 via conductive straps 180. The conductive straps may be formed of metal II and connected using, for example, a double poly double metal (DPDM) process. MSL(i) thus serves to decrease the resistance of the conventional N+ diffusion source line SL(i). The dimensions of the metal source line MSL(i) may be on the order of 3.3 μm wide by 0.9 μm thick. MSL(i) may be located above the N+ diffusion source line SL(i). Other relatively low resistance conductive materials may be used for MSL(i). These alternative materials include polycide, silicide, or metal layers other than metal II.

Each of the memory cells CijA and CijB may be a floating gate memory cell in which programming is accomplished by hot electron injection and erasing is accomplished by Fowler-Nordheim tunneling. The operation of such floating gate memory cells is well-known in the art and described in detail in the above-cited U.S. Pat. No. 5,029,130. Alternative memory cells may also be utilized in a memory array device in accordance with the present invention.

Figure 3:
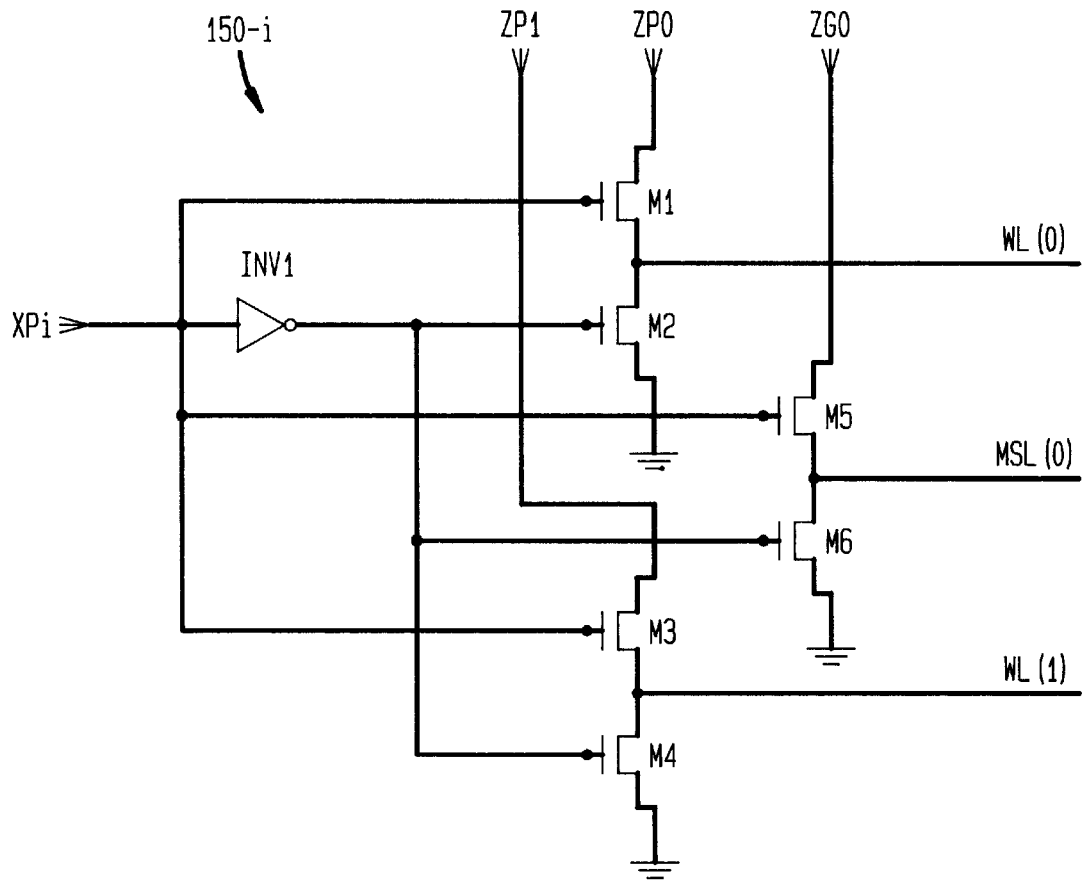
FIG. 3 shows an exemplary row decoder suitable for use in the memory device of FIG. 2.

FIG. 3 shows an exemplary row decoder 150-1 suitable for use in the memory array 140 of FIG. 2. The row address decoder 120 receives a row address as an input and decodes the row address to generate a plurality of row pre-decoder address signals XPi. Each of the row pre-decoder address signals XPi are supplied via a line 124-i as an input to a corresponding row decoder 150-i. Each row decoder 150-i receives three additional input signals ZP0, ZP1 and ZG0 from the row select decoder 119 via lines 130. The signals ZP0, ZP1 and ZG0 may be generated in row select decoder 119 or another suitable circuit using techniques such as those described in U.S. Pat. No. 5,289,411. An exemplary circuit for generating the signals ZP0 and ZP1 from a ZSUPPLY signal will be described in conjunction with FIG. 7 below. A given pre-decoder address signal XPi is applied directly to the gates of transistors M1, M3 and M5 and to the input of an inverter INV1. The complement of XPi from inverter INV1 is applied to the gates of transistors M2, M4 and M6. All of the transistors M1–M6 may be metal-oxide-semiconductor (MOS) field effect transistors of either P or N type. The row select signals ZP0, ZP1 and ZG0 from row select decoder 119 are applied to the drains of M1, M3 and M5, respectively. The outputs of row decoder 150-i are the even word line WL(0), the odd word line WL(1) and the source line MSL(0).

The outputs MSL(i) for each of the row decoders 150-i will be grounded during a read operation regardless of the row address and only one of the even or odd word lines will be selected by XPi. For example, if XPi is at a logic high level, even word line WL(0) is selected and thereby connected to signal ZP0 via transistor M1. The signal ZP0 may be generated from the voltage ZSUPPLY as shown in FIG. 7 below. The voltage ZSUPPLY is provided by a word line clamping circuit to be described in conjunction with FIG. 6 below. The voltage placed on even word line WL(0) will then be ZP0 less the threshold voltage Vt of M1. The voltage placed on odd word line WL(1) via transistor M3 will be ZP1 which may be ground potential for a read operation. During a program operation, the odd and even word lines WL(0) and WL(1) are selected in the same manner except that ZSUPPLY is changed to a +2 volt level suitable for storing charge on a floating gate of one of the memory cells. If the metal source line MSL(0) of FIG. 3 is selected by XPi going to a logic high level during a program operation, MSL(0) is connected to ZG0 via transistor M5. The signal ZG0 in this event may be the supply voltage Vcc. During an erase operation, XPi is at a logic high voltage level and WL(0) and WL(1) are connected via M1 and M3, respectively, to ZP0 and ZP1, respectively. Both ZP0 and ZP1 correspond to ZSUPPLY which during erase will be equivalent to Vcc. The voltage on WL(0) and WL(1) will therefore be on the order of Vcc-Vt. MSL(0) will be connected via transistor M5 to ZG0 which is at ground potential during an erase operation.

Figure 4:
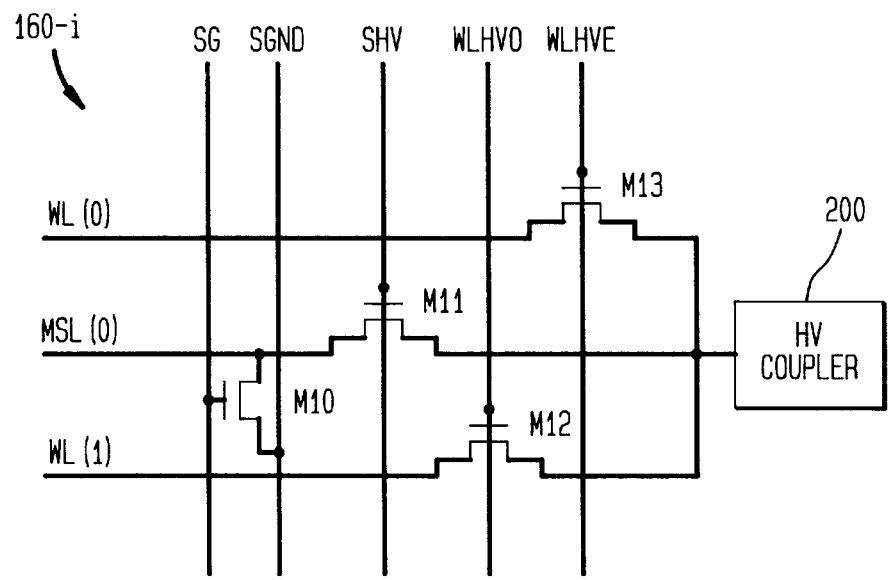
FIG. 4 shows an exemplary high voltage decoder suitable for use in the memory device of FIG. 2.

FIG. 4 shows an exemplary high voltage (HV) decoder 160-i suitable for use in the memory array 140. Each HV decoder 160-i is connected to the metal source line MSL and even and odd word lines WL of the corresponding row i as supplied from the row decoder 150-i of FIG. 3. The HV decoder 160-i receives inputs SG and SGND from a source ground circuit 205 to be described in conjunction with FIG. 5 below. The HV decoder 160-i also receives inputs SHV, WLHVO and WLHVE from the HV select decoder 121. The signals SHV, WLHVO and WLHVE are generated in decoder 121 using conventional techniques such as those described in U.S. Pat. No. 5,289,411. An HV coupler 200 couples a high voltage potential from the HV source 122 to the word line or source line selected by the row decoder 120-i and HV select decoder 121. The transistor M10 provides an additional current path during a read operation which serves to improve the read performance as will be described below.

Figure 5:
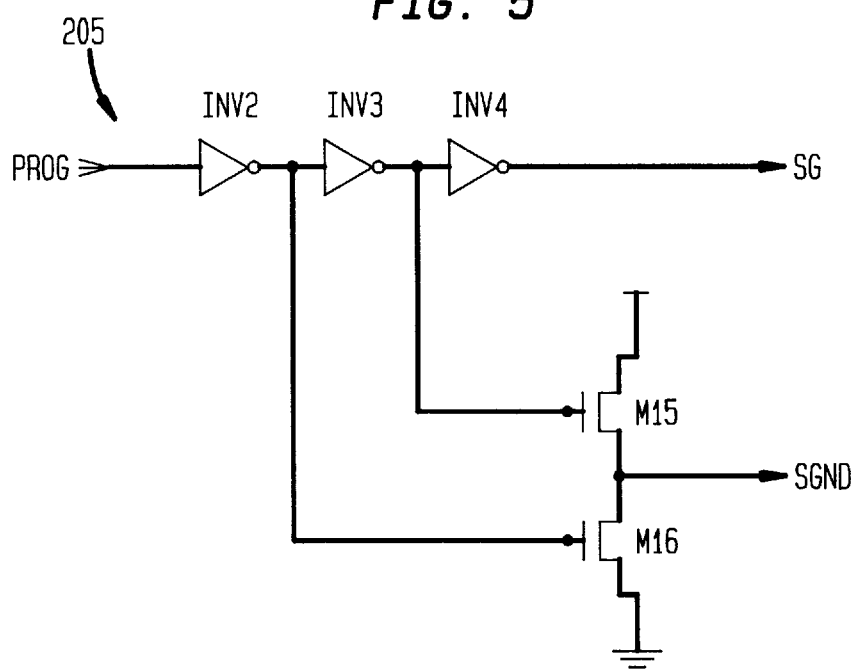
FIG. 5 shows an exemplary source ground circuit suitable for use in the memory device of FIG. 2.

FIG. 5 shows an exemplary source ground circuit 205 suitable for use in the memory device 100 of FIG. 2. The circuit 205 receives an input signal PROG which is at a logic high level during a program operation. When signal PROG is at a logic high level, transistor M16 receives the complement of PROG from inverter INV2 and is thus turned off. Transistor M15 receives the signal PROG from INV3 and is turned on. The signal SGND is therefore pulled to a logic high level via transistor M15. The signal SG at the output of inverter INV3 is at a logic low level when PROG is at a logic high. The output signals SG and SGND are supplied as inputs to the HV decoder 160-i of FIG. 4 and connected to the gate and source, respectively of the transistor M10 of decoder 160-i. The transistor M10 in NV decoder 160-i will therefore be turned off during a program operation and the drain voltage of M10 will be pulled high. This configuration also improves the punch-through voltage of transistor M10. During read and erase operations, the signal PROG is at a logic low level such that transistor M15 is turned off and transistor M16 is turned on. The signal SG is then high and the signal SGND is low, such that transistor M10 in HV decoder 160-i is turned on. The metal source line MSL(i) will therefore be connected via transistors M10 and M16 to ground potential during read and erase operations. This configuration thus supplies another ground path during read operations which improves the read performance.

Figure 6:
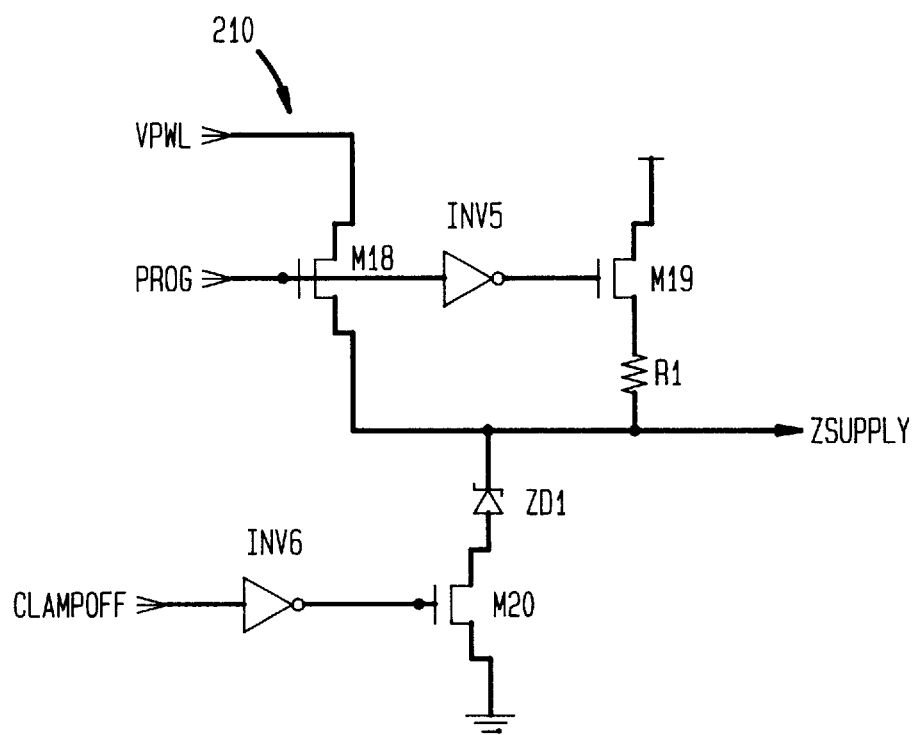
FIG. 6 shows an exemplary word line clamping circuit suitable for use in the memory device of FIG. 2.
Figure 7:
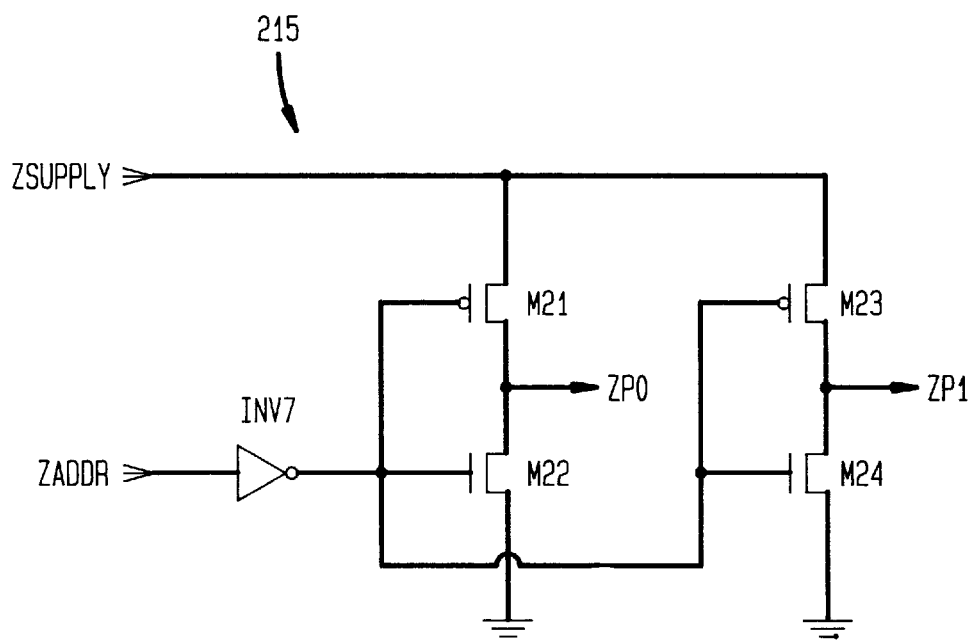
FIG. 7 shows a decoder suitable for generating the ZP0 and ZP1 inputs applied to the row decoder of FIG. 3.

FIG. 6 shows an exemplary word line clamping circuit 210 suitable for use in the memory array device of FIG. 2. The circuit 210 receives as inputs the signals PROG, VPWL and CLAMPOFF from a suitable memory control circuit (not shown). The circuit 210 generates an output signal ZSUPPLY which is supplied to a Z-decoder (ZDEC) circuit 215 shown in FIG. 7. The ZDEC circuit 215 generates the signals ZP0 and ZP1 using inverter INV7 and transistors M21–M24. The signals ZP0 and ZP1 are then supplied as inputs to the row decoder 150-i of FIG. 3. The ZDEC circuit 215 may be incorporated into the row select decoder 119 or into the word line clamping circuit 210.

The operation of the word line clamping circuit 210 of FIG. 6 will now be described in greater detail. During a program operation, the signals PROG and CLAMPOFF are at logic high levels and the signal VPWL is at about +2 volts. Transistor M18 is therefore turned on by PROG, transistor M19 is turned off by the complement of PROG from inverter INV5, and transistor M20 is turned off by the complement of CLAMPOFF from inverter INV6. The output signal ZSUPPLY is therefore connected to the signal VPWL which is about +2 volts during programming. The output ZSUPPLY is supplied to the ZDEC circuit 215 as shown in FIG. 7 and thereby to the ZP0 or ZP1 inputs of row decoder 150-i as shown in FIG. 3. During a read operation, PROG and CLAMPOFF are at logic low levels and transistor M18 is turned off while transistors M19 and M20 are turned on. The output ZSUPPLY is then a clamped version of the supply voltage Vcc. The breakdown voltage of the Zener diode ZD1 and the resistance value for resistor R1 determine the clamping voltage for the output signal ZSUPPLY. Suitable values for ZD1 breakdown voltage and R1 resistance are 4 volts and 1K ohms, respectively. Of course, these values may vary depending upon the application. During an erase operation, the signal PROG is low and the signal CLAMPOFF is high such that transistors M18 and M20 are turned off and transistor M19 is turned on. The output signal ZSUPPLY is then an unclamped version of supply voltage Vcc as supplied via M19 and R1.

The operation of the memory array device 100 of FIG. 2 will now be described in greater detail. TABLE 1 below summarizes the voltages applied to each terminal of an exemplary memory cell during erase, program and read operations. The listed voltages are for a cell of the type described in the above-cited U.S. Pat. No. 5,029,130. For a memory cell of this type, the drains of each cell CijA and CijB are connected to the bit line BL(j), the sources of each cell CijA or CljB are connected to the source line SL(i), the gates of each cell CijA are connected to even word line WL(i) and the gates of each cell CijB are connected to odd word lines WL(i+1). The sources of the cells CijA or CijB are also strapped to the metal source line MSL(i) via the straps 180 as previously described. Other types of memory cells may utilize different connections to the bit lines, word lines and source lines as well as different applied voltages for the program, erase and read operations.

TABLE 1

| OPERATION | DRAIN | GATE | SOURCE |
|---|---|---|---|
| PROGRAM | 0.6 V/5 V | Vt | +12 V |
| ERASE | 0 V | +15 V | 0 V |
| READ | +2 V | +5 V | 0 V |

An erase operation may be performed as follows. In accordance with one embodiment of the present invention, the memory cells Cij of array 140 are divided into pages, with each page including the cells CijA connected to an even word line WL(i) and the cells CijB connected to an odd word line WL(i+1). The minimum erase unit is a single page. The contents of the cells on an even and odd word line of a given row are thus erased simultaneously. When a particular page is to be erased, the row decoder 150-*i* that receives a pre-decoder address signal XPi at a logic high level activates the corresponding pair of even and odd word lines via the circuit of FIG. 3 while the word lines corresponding to the other row decoders remain inactive. The HV source 122 generates the +15 volt potential used for an erase operation. The HV select decoder 121 activates the WLHVO and WLHVE signals and deactivates the SHV signal, and the source ground circuit 205 of FIG. 5 activates signal SG to a logic high level and connects SGND to ground via transistor M16. These signals are supplied to the HV decoder 160-*i* of FIG. 4 and are operative to turn on the transistors M10, M12 and M13 and to turn off the transistor M11. The +15 volt potential from HV source 122 is then supplied via HV coupler 200 and transistors M12 and M13 to the desired even and odd word line pair. The corresponding source line MSL(i) is grounded via the transistor M10 of FIG. 4 and transistor M16 of FIG. 5.

The sources of cells Cij in the page to be erased are thus connected to ground potential via source line SL(i) and metal source line MSL(i). The gates of cells Cij in the page to be erased are connected to the +15 volt potential via the even word line WL(i) and the odd word line WL(i+1). The bit lines BL(j) are also connected to ground potential in the column address decoder 118 such that the drains of the cells Cij in the page to be erased are connected to ground potential. The erase conditions shown in TABLE 1 are therefore satisfied and the floating gate cells Cij in the selected page are erased via Fowler-Nordheim tunneling which removes charges previously stored on the floating gate as described in greater detail in the above-cited U.S. Pat. No. 5,029,130. The word lines and source lines of pages which are not selected for erasure are connected to ground potential via the transistors M2, M4 and M6 in the corresponding row decoders 150-*i*. The cells Cij in the unselected pages will therefore have drain, source and gate terminals connected to ground potential, such that no disturbance of charges previously stored therein will occur during the erase operation.

A program operation may be performed as follows. Again, in this exemplary embodiment the memory cells Cij of array 140 are divided into pages, with each page including the cells CijA connected to an even word line WL(i) and the cells CijB connected to an odd word line WL(i+1). The minimum program unit is a single page. When a particular page is to be programmed, the row decoder 150-*i* that receives a pre-decoder address signal XPi at a logic high level activates the corresponding word line pair and source line via the circuit of FIG. 3 while the word lines and source lines corresponding to the other row decoders remain inactive. The even word line WL(i) is connected via transistor M1 to signal ZP0, the odd word line WL(i+1) is connected via transistor M3 to signal ZP1 and the source line MSL(i) is connected via transistor M5 to signal ZG0. The HV source 122 generates the +12 volt potential used for a program operation. The HV select decoder 121 drives the SHV signal to a logic high level and the WLHVO and WLHVE signals to logic low levels, and the source ground circuit 205 of FIG. 5 drives signal SG to a logic low level and connects SGND to Vcc via transistor M15. These signals are supplied to the HV decoder 160-*i* of FIG. 4 and are operative to turn off the transistors M10, M12 and M13 and to turn on the transistor M11. The +12 volt potential from HV source 122 is then supplied via HV coupler 200 and transistor M11 to the desired source line MSL(i). The even and odd word line pair are connected to the ZP0 and ZP1 signals which correspond to the ZSUPPLY signal from the word line clamp circuit of FIG. 6. As described previously, the signal ZSUPPLY corresponds to signal VPWL during a program operation which results in a potential on the order of Vt being supplied to the even and odd word lines via transistors M1 and M3 of FIG. 3. The potential Vt may be approximately +2 volts.

The sources of cells Cij in the page to be programmed are thus connected to the +12 volt potential from HV source 122 via source line SL(i) and metal source line MSL(i). The gates of cells Cij in the page to be programmed are connected to the Vt potential via the even word line WL(i) and the odd word line WL(i+1). The column address decoder 118 in response to program data from the input buffer 112 controls the bit lines BL(j) in order to program the desired data values into the cells Cij. To program a logic one data bit, the bit line BL(j) for the corresponding cell is set to 0.6 volts. To program a logic zero data bit, the bit line BL(j) for the corresponding cell is set to +5 volts such that the logic zero value present in the cell from a previous erasure remains unchanged. The program conditions shown in TABLE 1 are therefore satisfied and the floating gate cells Cij in the selected page are programmed via hot carrier injection which transfers charge to the floating gate as described in greater detail in the above-cited U.S. Pat. No. 5,029,130. The word lines and source lines of pages which are not selected for programming are connected to ground potential via the transistors M2, M4 and M6 in the corresponding row decoders 150-*i*. The different bias conditions for cells Cij in the array 140 during a program operation are summarized below.

1. Selected page, word line and column with data=0

DRAIN=0.6V

GATE=2V

SOURCE=12V

2. Selected page, word line and column with data=1

DRAIN=5V

GATE=2V

SOURCE=12V

3. Selected page and word line and unselected column

DRAIN=5V

GATE=2V

SOURCE=12V

4. Selected page, other word line and selected column with data=0

DRAIN=0.6V
GATE=0V
SOURCE=12V

5. Selected page, other word line and selected column with data=1
   DRAIN=5V
   GATE=0V
   SOURCE=12V 6. Selected page, other word line and unselected column
   DRAIN=5V
   GATE=0V
   SOURCE=12V 7. Unselected page, other word line and selected column with data=0
   DRAIN=0.6V
   GATE=0V
   SOURCE=12V 8. Unselected page, other word line and selected column with data=1
   DRAIN=5V
   GATE=0V
   SOURCE=0V 9. Unselected page, other word line and unselected column
   DRAIN=5V
   GATE=0V
   SOURCE=0V It can be seen from the above bias conditions that program disturbances in the memory array 140 of the present invention are substantially limited to cells Cij within a selected page. The cells Cij in the unselected pages are biased such that the charges previously stored within these cells will generally not be disturbed when programming the selected page.

TABLE 1 indicates that a read operation is performed by applying a +2 volt potential to the drains of the cells Cij of a selected page via bit lines BL(j), a +5 volt potential to the gates via even word line WL(i) and odd word line WL(i+1), and ground potential to the sources via the source lines SL(i) and MSL(i). These potentials are supplied in a manner similar to that previously described for the erase and program operations. The signal ZSUPPLY supplied to the even and odd word lines during a read operation via the transistors M1 and M3 of FIG. 3 will be clamped by the word line clamp circuit 210 of FIG. 6 as was described above. The memory array 140 of the present invention will therefore be less susceptible to gate disturbance during read operations. The prior art memory devices previously described applied Vcc-Vt directly to the gates of the selected cells such that increases or other disturbances in Vcc would be likely to result in a gate disturbance within the array.

The above-described embodiments of the invention are intended to be illustrative only. Numerous alternative embodiments within the scope of the appended claims will be apparent to those of ordinary skill in the art.

The claimed invention is:

1. A semiconductor memory array for use in a memory device in which the location of a particular memory cell in the array is specified by a row address decoded by a row address decoder and a column address decoded by a column address decoder, the array comprising:
   a plurality of bit lines connected to the column address decoder;
   a plurality of word lines connected to the row address decoder;
   a plurality of source lines connected to the row address decoder;
   a plurality of floating gate memory cells each having a source or drain connected to one of the bit lines, a gate connected to one of the word lines and a source or drain connected to one of the source lines; and
   a word line clamping circuit for limiting a voltage applied to a given word line during a read operation to a level which prevents charges previously stored on floating gates of memory cells on the given word line from being pulled away from the floating gates via tunneling during the read operation.

2. The array of claim 1 wherein the word line clamping circuit limits the voltage applied to the given word line during a read operation to a value of about four volts.

3. The array of claim 1 wherein the plurality of word lines further includes alternating even word lines and odd word lines, and wherein a basic program unit in the memory array is a page including a pair of adjacent even and odd word lines.

4. The array of claim 3 wherein the pair of adjacent even and odd word lines are erased substantially simultaneously during an erase operation.

5. A method for use in a semiconductor memory array device including a plurality of bit lines, a plurality of word lines, a plurality of source lines and a plurality of floating gate memory cells each having a source or drain connected to one of the bit lines, a gate connected to one of the word lines and a source or drain connected to one of the source lines, the method including the steps of:
   applying a voltage to a given word line during a read operation; and
   limiting the voltage applied to the given word line during the read operation to a level which prevents charges previously stored on floating gates of memory cells on the given word line from being pulled away via tunneling during the read operation.

6. The method of claim 5 wherein the step of limiting the voltage applied to the given word line during a read operation further includes limiting the voltage to a value of about four volts.

7. The method of claim 5 wherein the plurality of word lines further includes alternating even word lines and odd word lines, and wherein a basic program unit in the memory array is a page including a pair of adjacent even and odd word lines.

8. The method of claim 7 further including the step of erasing the pair of adjacent even and odd word lines substantially simultaneously during an erase operation.

9. A semiconductor memory array comprising:
   a plurality of bit lines;
   a plurality of word lines;
   a plurality of source lines;
   a plurality of floating gate memory cells each having a source or drain connected to one of the word lines and a source or drain connected to one of the source lines; and
   a word line clamping circuit for limiting a voltage applied to a given word line during a read operation to a level which prevents charges previously stored on floating gates of memory cells on the given word line from being pulled away from the floating gates via tunneling during the read operation.

10. The array of claim 9 wherein the word line clamping circuit limits the voltage applied to the given word line during a read operation to a value of about four volts.

* * * * *